United States Patent
Ahirwar et al.

(10) Patent No.: US 10,879,928 B2
(45) Date of Patent: Dec. 29, 2020

(54) SCALING OF LOG-LIKELIHOOD RATIOS (LLR) BASED ON LONG TRAINING FIELD (LTF)

(71) Applicant: Marvell World Trade Ltd., St. Michael (BB)

(72) Inventors: Vijay Ahirwar, Pune (IN); Sri Varsha Rottela, Visakhapatnam (IN); B Hari Ram, Chennai (IN)

(73) Assignee: MARVELL ASIA PTE, LTD., Singapore (SG)

( * ) Notice: Subject to any disclaimer, the term of this patent is extended or adjusted under 35 U.S.C. 154(b) by 12 days.

(21) Appl. No.: 16/352,886

(22) Filed: Mar. 14, 2019

(65) Prior Publication Data

US 2019/0222225 A1 Jul. 18, 2019

Related U.S. Application Data

(63) Continuation-in-part of application No. 15/792,348, filed on Oct. 24, 2017, now Pat. No. 10,574,273.
(Continued)

(51) Int. Cl.
*H03M 13/00* (2006.01)
*H03M 13/11* (2006.01)
(Continued)

(52) U.S. Cl.
CPC .......... *H03M 13/112* (2013.01); *G06F 17/18* (2013.01); *H04L 1/0005* (2013.01);
(Continued)

(58) Field of Classification Search
CPC .. H03M 13/112; H04L 1/0005; H04L 1/0045; H04L 25/067; G06F 17/18; H04W 84/12
See application file for complete search history.

(56) References Cited

U.S. PATENT DOCUMENTS 7,876,860 B1   1/2011  Varnica et al.
8,286,048 B1 * 10/2012 Chen .................. H03M 13/1128
                                                  714/752
(Continued)

FOREIGN PATENT DOCUMENTS

EP       2204984 A1  7/2010
WO  2010058957 A2   5/2010

OTHER PUBLICATIONS

Song et al., "A normalized LLR soft information demapping method in DTMB system", 11th IEEE Singapore International Conference on Communication Systems, pp. 1297-1301, year 2008.
(Continued)

*Primary Examiner* — Samir W Rizk

(57) ABSTRACT

A receiver is configured for receiving a signal including a training field and a payload over a communication channel. The receiver includes a channel estimator, a scaling factor calculator, a metric calculator and a decoder. The channel estimator is configured to estimate values of a parameter of the communication channel based on the training field of the received signal. The scaling factor calculator is configured to calculate a scaling factor based on the values of the parameter of the communication channel. The metric calculator is configured to calculate soft decoding metrics for use in decoding data carried by the payload of the received signal, including scaling the soft decoding metrics by the scaling factor. The decoder is configured to decode the data carried by the payload of the received signal using the scaled soft decoding metrics.

19 Claims, 2 Drawing Sheets

Related U.S. Application Data

(60) Provisional application No. 62/644,146, filed on Mar. 16, 2018, provisional application No. 62/412,232, filed on Oct. 24, 2016.

(51) Int. Cl.
*H04L 1/00* (2006.01)
*G06F 17/18* (2006.01)
*H04L 25/06* (2006.01)
*H04W 84/12* (2009.01)

(52) U.S. Cl.
CPC .......... *H04L 1/0045* (2013.01); *H04L 25/067* (2013.01); *H04W 84/12* (2013.01)

(56) References Cited

U.S. PATENT DOCUMENTS

| | | | |
|---|---|---|---|
| 8,325,860 B2 | 12/2012 | Gomadam et al. | |
| 8,543,063 B2 | 9/2013 | Bergel et al. | |
| 8,582,696 B2 | 11/2013 | Oh et al. | |
| 8,605,841 B2 | 12/2013 | Bury | |
| 9,031,597 B2 | 5/2015 | Zhang et al. | |
| 9,048,970 B1 | 6/2015 | Gomadam et al. | |
| 9,124,327 B2 | 9/2015 | Gomadam et al. | |
| 9,143,951 B2 | 9/2015 | Gomadam et al. | |
| 9,220,087 B1 | 12/2015 | Gomadam et al. | |
| 9,348,776 B2 | 5/2016 | Liu et al. | |
| 9,461,671 B1 | 10/2016 | Chang et al. | |
| 9,875,157 B2 | 1/2018 | Kou et al. | |
| 10,191,804 B2 | 1/2019 | Tehrani et al. | |
| 2004/0128592 A1 | 7/2004 | Park | |
| 2011/0173518 A1 | 7/2011 | Jan et al. | |
| 2013/0051444 A1 | 2/2013 | Roh | |
| 2013/0301447 A1 | 11/2013 | Gomadam | |
| 2015/0135031 A1 | 5/2015 | Cohen et al. | |
| 2016/0092301 A1 | 3/2016 | Ish-Shalom et al. | |
| 2016/0226528 A1 | 8/2016 | Serbeti et al. | |
| 2016/0226552 A1 | 8/2016 | Jin et al. | |
| 2018/0109354 A1 | 4/2018 | Ahirwar et al. | |
| 2018/0198559 A1* | 7/2018 | Lopez | H04L 1/0075 |

OTHER PUBLICATIONS

IEEE Std 802.11ac™, IEEE Standard for Information technology—Telecommunications and information exchange between systems Local and metropolitan area networks—Specific requirements, "Part 11: Wireless LAN Medium Access Control (MAC) and Physical Layer (PHY) Specifications Amendment 4: Enhancements for Very High Throughput for Operation in Bands below 6 GHz", pp. 1-425, year 2013.

IEEE P802.11ax™/D2.0, Draft Standard for Information technology—Telecommunications and information exchange between systems Local and metropolitan area networks—Specific requirements, Part 11: Wireless LAN Medium Access Control (MAC) and Physical Layer (PHY) Specification, Amendment 6: Enhancements for High Efficiency WLAN, pp. 1-596, Oct. 2017.

IEEE P802.11n, IEEE Standard for information technology—Telecommunications and information exchange between systems—Local and metropolitan area networks—Specific requirements, Part 11: Wireless LAN Medium Access Control (MAC) and Physical Layer (PHY) specifications, Amendment 5,: Enhancements for higher Throughput, pp. 1-536, year 2009.

Rottela et al., U.S. Appl. No. 15/792,348, filed Oct. 24, 2017.

Archambault, E., "Methods for using patents in cross-country comparisons", Scientometrics, Akadémiai Kiadó, vol. 54, issue 1, pp. 15-30, year 2002.

* cited by examiner

SCALING OF LOG-LIKELIHOOD RATIOS (LLR) BASED ON LONG TRAINING FIELD (LTF)

CROSS-REFERENCE TO RELATED APPLICATIONS

This application claims the benefit of U.S. Provisional Patent Application 62/644,146, filed Mar. 16, 2018. This application is also a continuation-in-part of U.S. patent application Ser. No. 15/792,348, filed Oct. 24, 2017. The disclosures of these related application are incorporated herein by reference.

FIELD OF THE DISCLOSURE

The present disclosure relates generally to communication receivers, and particularly to methods and systems for scaling of soft decoding metrics such as Log-Likelihood Ratios (LLRs).

BACKGROUND

Various communication protocols define training fields that are used by receivers for channel estimation. For example, the IEEE 802.11 family of Wireless Local Area Networks (WLANs) standards specify Long Training Fields (LTFs) as part of the WLAN frame structure.

The description above is presented as a general overview of related art in this field and should not be construed as an admission that any of the information it contains constitutes prior art against the present patent application.

SUMMARY

An embodiment that is described herein provides a receiver for receiving a signal including a training field and a payload over a communication channel. The receiver includes a channel estimator, a scaling factor calculator, a metric calculator and a decoder. The channel estimator is configured to estimate values of a parameter of the communication channel based on the training field of the received signal. The scaling factor calculator is configured to calculate a scaling factor based on the values of the parameter of the communication channel. The metric calculator is configured to calculate soft decoding metrics for use in decoding data carried by the payload of the received signal, including scaling the soft decoding metrics by the scaling factor. The decoder is configured to decode the data carried by the payload of the received signal using the scaled soft decoding metrics.

In some embodiments, the training field precedes the payload in the signal, and the scaling factor calculator is configured to calculate the scaling factor before a beginning of the payload is received at the receiver. In some embodiments, the scaling factor calculator is configured to estimate a statistical distribution of the values of the parameter of the communication channel, and to derive the scaling factor from the estimated statistical distribution.

In some embodiments, the scaling factor calculator is configured to construct a histogram of the values of the parameter of the communication channel, and to derive the scaling factor from the histogram. In an embodiment, the scaling factor calculator is configured to populate the histogram with power-gain levels of the communication channel, each power-gain level calculated over a respective sub-carrier and a respective spatial stream of the signal. In another embodiment, the scaling factor calculator is configured to identify in the histogram a bin having a highest count of the values of the parameter of the communication channel, and to set the scaling factor depending on an identity of the bin. In yet another embodiment, the scaling factor calculator is configured to identify in the histogram a highest-index bin for which a count of the values of the parameter of the communication channel exceeds a predefined threshold, and to set the scaling factor depending on an identity of the bin.

In a disclosed embodiment, the signal includes a plurality of sub-carriers transmitted at respective different sub-carrier frequencies, and the scaling factor calculator is configured to calculate the scaling factor over only a selected subset of the sub-carriers. Additionally or alternatively, the signal includes a plurality of spatial streams, and the scaling factor calculator is configured to calculate the scaling factor over only a selected subset of the spatial streams.

In some embodiments, the scaling factor calculator is configured to calculate two or more interim scaling factors based on two or more respective parts of the training field, and to calculate the scaling factor by combining the interim scaling factors. In an example embodiment, the two or more parts of the training field include respective subsets of sub-carriers having respective different sub-carrier frequencies. In another example embodiment, the two or more parts of the training field include respective spatial streams.

In some embodiments, the training field is modulated using a first modulation scheme, the payload is modulated using a second modulation scheme that is different from the first modulation scheme, and the scaling factor calculator is configured to apply to the scaling factor a correction that depends on the first modulation scheme and on the second modulation scheme. In an embodiment, the scaling factor calculator is configured to correct the scaling factor to retain a same minimal Euclidean distance in the first modulation scheme and in the second modulation scheme. In another embodiment, the training field is included in a preamble of the signal, and the metric calculator is configured to scale the soft decoding metrics for payload bits of the signal that are subsequent to the preamble. In yet another embodiment, the training field is included in a mid-amble of the signal, and the metric calculator is configured to scale the soft decoding metrics for payload bits that are subsequent to the mid-amble, provided that any code word of the signal is scaled by a same scaling factor.

In some embodiments, the scaling factor calculator is configured to calculate the scaling factor independently of any portion of the payload.

There is additionally provided, in accordance with an embodiment that is described herein, a receiver for receiving a signal over a communication channel. The receiver includes a channel estimator, a scaling factor calculator, a metric calculator and a decoder. The channel estimator is configured to estimate values of a parameter of the communication channel based on a part of the received signal. The scaling factor calculator is configured to calculate a scaling factor based on the values of the parameter of the communication channel. The metric calculator is configured to calculate soft decoding metrics for use in decoding an other part of the received signal, including scaling the soft decoding metrics by the scaling factor that was calculated over the part of the received signal. The decoder is configured to decode the other part of the received signal using the scaled soft decoding metrics.

In some embodiments, the part of the received signal is modulated using a first modulation scheme, the other part of the received signal is modulated using a second modulation scheme that is different from the first modulation scheme, and the scaling factor calculator is configured to calculate the scaling factor for the other part modulated using a second modulation scheme, based on the values of the parameter of the communication channel estimated over the part of the received signal modulated using the first modulation scheme.

In an example embodiment, the scaling factor calculator is configured to apply to the scaling factor a correction that depends on the first modulation scheme and on the second modulation scheme. In an embodiment, the scaling factor calculator is configured to correct the scaling factor to retain a same minimal Euclidean distance in the first modulation scheme and in the second modulation scheme. In another embodiment, the part modulated using the first modulation scheme includes a training field, and the other part, modulated using the second modulation scheme, includes a payload.

In a disclosed embodiment, the training field is included in a preamble of the signal, and the metric calculator is configured to scale the soft decoding metrics for bits of the payload that are subsequent to the preamble. In another embodiment, the training field is included in a mid-amble of the signal, and the metric calculator is configured to scale the soft decoding metrics for bits of the payload that are subsequent to the mid-amble, provided that any code word of the signal is scaled by a same scaling factor.

There is also provided, in accordance with an embodiment that is described herein, a method for decoding a signal including a training field and a payload received over a communication channel. The method includes estimating values of a parameter of the communication channel based on the training field of the received signal. A scaling factor is calculated based on the estimated values of the parameter of the communication channel. Soft decoding metrics, for use in decoding data carried by the payload of the received signal, are calculated, including scaling the soft decoding metrics by the scaling factor. The data carried by the payload of the received signal is decoded using the scaled soft decoding metrics.

There is further provided, in accordance with an embodiment that is described herein, a method for decoding a signal received over a communication channel. The method includes estimating values of a parameter of the communication channel based on a part of the received signal. A scaling factor is calculated based on the values of the parameter of the communication channel. Soft decoding metrics, for use in decoding an other part of the received signal, are calculated, including scaling the soft decoding metrics by the scaling factor that was calculated over the part of the received signal. The other part of the received signal is decoded using the scaled soft decoding metrics.

The present disclosure will be more fully understood from the following detailed description of the embodiments thereof, taken together with the drawings in which:

DETAILED DESCRIPTION OF EMBODIMENTS

Figure 1:
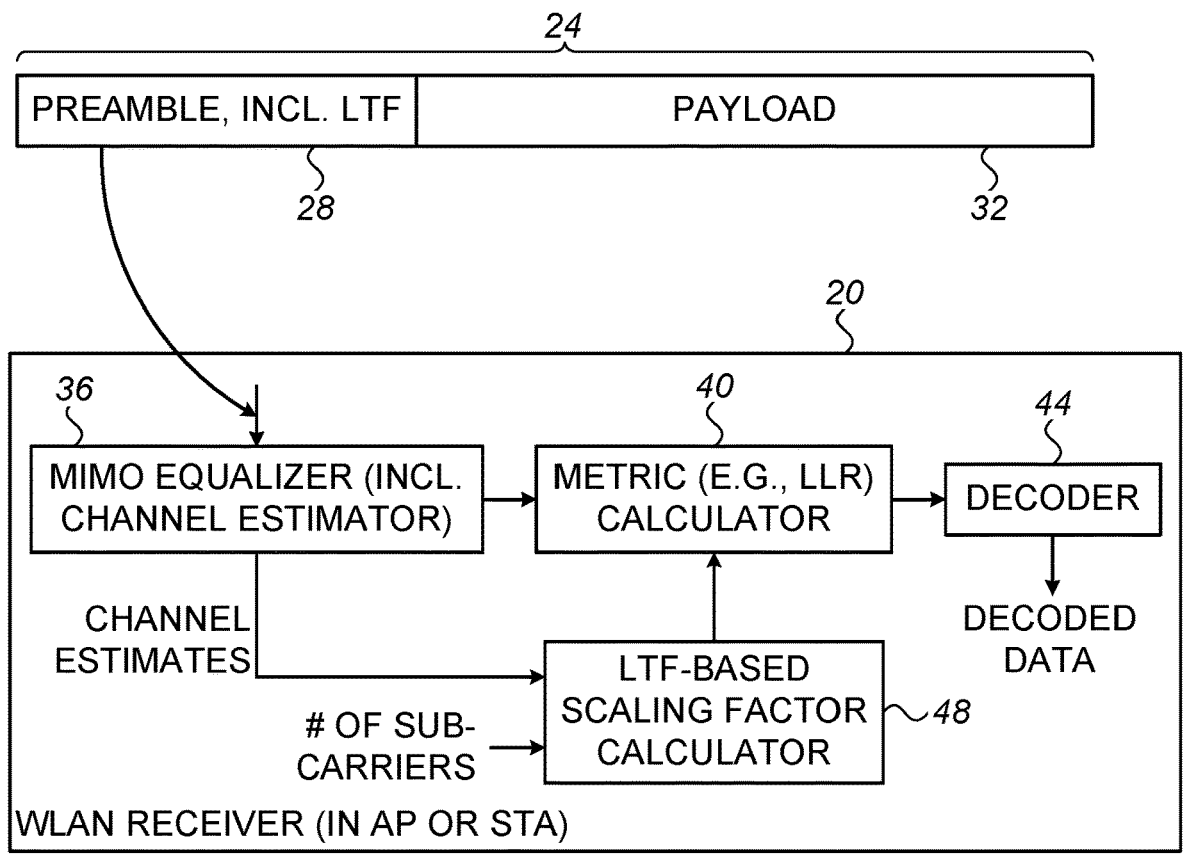
FIG. 1 is a simplified block diagram that schematically illustrates a Wireless Local Area Network (WLAN) receiver, in accordance with an embodiment that is described herein.

Soft decoding metrics are used in communication receivers, for example, for soft decoding of Forward Error Correction (FEC) codes. In the context of the present disclosure, the term "soft decoding metric" refers to a multi-bit (i.e., non-binary) value that is indicative of the reliability or confidence level of a received bit or symbol.

One common example of a soft decoding metric is a Log-Likelihood Ratio (LLR). The LLR of a received data bit is defined as the logarithm of the ratio of two probabilities—the probability that the transmitted value of the data bit was "0", and the probability that the transmitted value of the data bit was "1". An LLR having a high absolute value corresponds to a high confidence level as to the transmitted bit value, and an LLR whose absolute value is close to zero corresponds to a low confidence level. The description that follows refers to LLRs by way of example. Generally, however, the disclosed techniques are applicable to any other suitable type of soft decoding metric.

In digital communication receivers, FEC decoding is typically implemented using fixed-point operations. When calculating LLRs for use by a fixed-point FEC decoder, careful consideration of dynamic range should be taken in order to avoid saturation as well as poor Signal-to-Noise Ratio (SNR). Thus, for optimal decoding, the LLRs should be scaled such that the dynamic range of the LLRs best matches the dynamic range expected by the decoder. Typically, all the LLRs belonging to the same packet or frame, or at least to the same FEC code word, should be scaled with the same scaling factor.

In many practical cases, however, the overall possible dynamic range of LLRs is considerably larger than the dynamic range of the LLRs expected by the FEC decoder. Moreover, the statistical distribution and dynamic range of LLRs typically vary depending on various factors, such as the type of communication channel (e.g., deep fading vs. line-of-sight), received signal strength and Modulation and Coding Scheme (MCS). As such, correct scaling of the LLR values is a challenging task. Accurate LLR scaling is also computationally intensive, and may therefore cause undesired latency in the receiver.

Embodiments that are described herein provide improved methods and apparatus for computing and using soft decoding metrics, e.g., LLRs, in communication receivers. The embodiments described herein refer mainly to receivers of WLAN devices, e.g., Access Points (APs) or stations (STAs), but the disclosed techniques are applicable in any other suitable type of receiver.

In some embodiments, a receiver is configured to receive a signal that carries packets (also referred to as frames) over a communication channel. Each packet comprises a training field, e.g. a LTF, and a payload. The receiver uses the training field, in an embodiment, to calculate a scaling factor, which is later used for scaling the LLRs of the payload. The calculation of the scaling factor is thus independent of any portion of the payload. Taking advantage of this property, in some implementations the receiver completes calculation of the scaling factor before receiving the beginning of the payload. Consequently the receiver is able to scale the LLRs of the payload on-the-fly, i.e., without having to buffer the LLRs in memory for the sake of scaling. Such on-the-fly operation reduces latency as well as memory requirements.

In some embodiments, the receiver comprises a channel estimator, a scaling factor calculator, a metric calculator and a FEC decoder. The channel estimator estimates values of a parameter of the communication channel based on the training field. The scaling factor calculator uses the estimated channel parameter values to calculate the scaling factor. The metric calculator calculates LLRs for the data bits of the payload, including scaling the LLRs by the scaling factor. The FEC decoder decodes the data bits of the payload using the scaled soft decoding metrics.

In one example embodiment that is explained in detail below, the received signal is an Orthogonal Frequency Division Modulation (OFDM) signal comprising multiple sub-carriers that are transmitted at respective different sub-carrier frequencies. The channel estimator is embodied in a Zero-Forcing (ZF) Multiple-Input Multiple-Output (MIMO) equalizer. The channel parameter values comprise power-gain values (denoted $|r_{ii}|^2$), each computed over a respective spatial stream and a respective OFDM sub-carrier. It can be shown that the power-gain values $|r_{ii}|^2$ are good approximations of the corresponding LLRs. The scaling factor calculator constructs a histogram of multiple $|r_{ii}|^2$ values estimated over the training field, and derives the scaling factor from the histogram. Various example techniques for defining the histogram, for choosing $|r_{ii}|^2$ values for populating the histogram, and for deriving the scaling factor from the histogram, are described herein.

It is noted that a histogram is regarded herein as one non-limiting example of a statistical distribution of channel parameter values. In various embodiments, the scaling factor calculator may use any other technique or representation for estimating the statistical distribution of channel parameter values (e.g., power-gain values $|r_{ii}|^2$), and derive the scaling factor from the estimated statistical distribution.

In some embodiments, the training field is comprised in a preamble of the signal, in which case the entire payload is subsequent to the training field. In other embodiments, the training field is comprised in a mid-amble of the signal. In these embodiments, the receiver scales the LLRs of the payload bits that are subsequent to the mid-amble, provided that any given FEC code word is scaled using the same scaling factor.

In some embodiments, the training field is modulated using one modulation scheme, and the payload is modulated using a different modulation scheme. Techniques for correcting the histogram and/or the scaling factor, to account for the difference in modulation between the training field and the payload, are also described.

FIG. 1 is a block diagram that schematically illustrates a Wireless Local Area Network (WLAN) receiver 20, in accordance with an embodiment that is described herein. In some embodiments receiver 20 is part of a WLAN Access Point (AP) that receives signals from one or more WLAN stations (STAs). In other embodiments receiver 20 is part of a STA that receives signals from an AP. Receiver 20 may operate in accordance with any suitable WLAN standard of protocol, such as any of the IEEE 802.11 family of standards. Some non-limiting example variants of this standard include 802.11n, 802.11ac and 802.11ax.

Typically, the signal received by receiver 20 comprises one or more packets 24 (also referred to as frames). In the present example, each packet 24 comprises a preamble 28 followed by a payload 32. Preamble 28 comprises a training field. Payload 32 comprises data bits that are encoded with a FEC, e.g., a Binary Convolutional Code (BCC) or Low-Density Parity Check (LDPC) code.

In the present context, the term "training field" refers to a sequence of bits whose values are predefined and known to the receiver. In the embodiments described herein, the training field comprises a Long Training Field (LTF). Various types of LTF are specified in various variants of the IEEE 802.11 standard, e.g., Legacy-LTF (L-LTF), High-Throughput LTF (HT-LTF), Very-High-Throughput LTF (VHT-LTF) and High-Efficiency LTF (HE-LTF). Any and all such variants, as well as future contemplated variants, are regarded herein as non-limiting examples of LTFs.

In an embodiment, the received signal (both preamble 28 and payload 32) is modulated using Orthogonal Frequency Division Modulation (OFDM). Each OFDM symbol comprises multiple sub-carriers having respective frequencies. Each individual sub-carrier is modulated with a suitable modulation scheme, which may differ between preamble 28 and payload 32. In an example embodiment, in the OFDM symbols that carry the LTF, the sub-carriers are modulated using Binary Phase Shift Keying (BPSK) modulation, and in the OFDM symbols that carry payload 32, the sub-carriers are modulated using four-symbol or higher Quadrature Amplitude Modulation (QAM).

In the embodiment of FIG. 1, receiver 20 comprises a Multiple-Input Multiple-Output (MIMO) equalizer 36, a metric calculator 40, a FEC decoder 44 and a LTF-based scaling factor calculator 48. Among other tasks, equalizer 36 estimates parameter values of the communication channel over which packets 24 are received. Thus, in the present context equalizer 36 is considered a non-limiting example of a channel estimator. Metric calculator 40 calculates soft decoding metrics, in the present example LLRs, of the data bits of payload 32. FEC decoder 44 (also referred to as "decoder" for brevity) decodes the FEC-encoded data bits of payload 32 using the LLRs. The decoded data is provided as output, e.g., to higher layers.

In an embodiment, scaling factor calculator 48 receives as input (i) the estimated parameter values of the communication channel from equalizer 36, and (ii) the total number of data sub-carriers in the received signal. Scaling factor calculator 48 calculates a scaling factor based on these inputs, and provides the scaling factor to metric calculator 40. The operation of scaling factor calculator 48 is explained in detail below. Metric calculator 40 scales the LLRs of the payload with the scaling factor, as part of the LLR calculation process. Thus, decoder 44 decodes the data carried by payload 32 using the scaled LLRs.

The receiver configuration depicted in FIG. 1 is an example configuration, which was chosen solely for the sake of conceptual clarity. In alternative embodiments, any other suitable receiver configuration can be used. Elements that are not mandatory for understanding of the disclosed techniques have been omitted from the figure for the sake of clarity.

The various elements of receiver 20, e.g., MIMO equalizer 36 (or other form of channel estimator), metric calculator 40, decoder 44 and scaling factor calculator 48, may be implemented using dedicated hardware or firmware, such as using hard-wired or programmable logic, e.g., in an Application-Specific Integrated Circuit (ASICs) or Field-Programmable Gate Array (FPGA), using software, or using a combination of hardware and software elements.

Some functions of receiver 20, e.g., some or all of the functions of MIMO equalizer 36 (or other form of channel estimator), metric calculator 40, decoder 44 and scaling factor calculator 48, may be implemented using a programmable processor, e.g., a Digital Signal Processor (DSP), which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an embodiment, receiver 20 is a MIMO receiver, which receives the signal via multiple receive antennas. Without loss of generality, in the description that follows the number of receive antennas (denoted Nrx) is four. The signal conveys one or more spatial streams, also referred to as spatial layers. Without loss of generality, in the description that follows the number of spatial streams (denoted Nss) is four. In alternative embodiments, any other suitable number of receive antennas and any other suitable number of spatial streams can be used.

In an embodiment, the received signal can be written as:

$$y = \begin{bmatrix} h_{11} & \cdots & h_{14} \\ \vdots & \ddots & \vdots \\ h_{41} & \cdots & h_{44} \end{bmatrix} \begin{bmatrix} x_1 \\ \vdots \\ x_4 \end{bmatrix} + n1 \quad \text{Equation 1}$$

wherein the matrix of $h_{ij}$ values (referred to as a channel matrix and denoted H) is of size Nrx-by-Nss, in the present example 4-by-4, and n1 denotes a noise vector.

In an embodiment, MIMO equalizer 36 is a Zero-Forcing (ZF) equalizer. After zeroing-out the inter-stream interference, the equalized signal at the output of equalizer 36 is given by:

$$y = \begin{bmatrix} r_{11} & 0 & 0 & 0 \\ 0 & r_{22} & 0 & 0 \\ 0 & 0 & r_{33} & 0 \\ 0 & 0 & 0 & r_{44} \end{bmatrix} \begin{bmatrix} x_1 \\ \vdots \\ x_4 \end{bmatrix} + n2 \quad \text{Equation 2}$$

wherein $r_{ii}$ denotes the complex gain of the MIMO communication channel for the $i^{th}$ spatial stream, i=1 . . . Nss.

In an embodiment, scaling factor calculator 48 calculates a plurality of channel parameter values of the form $|r_{ii}|^2$. Each channel parameter value $|r_{ii}|^2$ is calculated for a given spatial stream and for a given OFDM sub-carrier of the LTF. In other words, each channel parameter value represents the power-gain of the communication channel for the spatial stream and the sub-carrier in question. The maximal number of channel parameter values is therefore Nss×nSD, wherein nSD denotes the total number of data sub-carriers in the OFDM symbol. As will be explained below, in some embodiments scaling factor calculator 48 calculates only a partial subset of the channel parameter values.

It can be shown that the channel power-gains $|r_{ii}|^2$ can be used as approximations of the corresponding LLRs. Unlike LLRs, however, the channel power-gains are simpler to calculate. In the case of ZF equalization, the channel power-gains are available as a by-product of the equalization process, by taking the diagonal elements of the modified channel matrix after equalization (Equation 2). A mathematical derivation showing the accuracy of the approximation is given in U.S. Provisional Patent Application 62/644,146, which was cited above and whose disclosure is incorporated herein by reference. In this derivation it is shown, for example, that when the LLRs are computed for a BPSK-modulated LTF sequence multiplied with a P-matrix (as specified in IEEE 802.11), the LLRs turn out to be scaled values of $|r_{ii}|^2$. The approximation holds for other types of equalization, e.g., Linear Minimum Mean Square Error (LMMSE) equalization, as well.

In some embodiments, scaling factor calculator 48 estimates a statistical distribution of channel parameter values (in the present example power-gain values $|r_{ii}|^2$), and derives the scaling factor from the estimated statistical distribution. The description that follows focuses on an example implementation in which the statistical distribution is represented by a histogram. The disclosed techniques, however, are in no way limited to a histogram or to any other implementation, representation or data structure.

In an embodiment, scaling factor calculator 48 constructs a histogram of channel power-gains $|r_{ii}|^2$, and derives the scaling factor from the histogram. In constructing the histogram, scaling factor calculator 48 divides the dynamic range of power-gain values $|r_{ii}|^2$ into multiple sub-ranges referred to as bins. The number of bins is denoted n.

In some embodiments the bins are of equal size, i.e., [0, Δ), [Δ, 2Δ), [2Δ, 3Δ), . . . , [($2^{n-1}$−1)Δ, $2^{n-1}$Δ), wherein Δ denotes the bin size. In other embodiments the bin sizes are distributed non-uniformly. In one example embodiment the bin sizes are distributed logarithmically, e.g., [0, Δ), [Δ, 2Δ), [2Δ, 4Δ), [4Δ, 8Δ), . . . , [($2^{n-2}$)Δ, $2^{n-1}$Δ). Scaling factor calculator 48 may set the value of Δ, adaptively or in a predefined manner, e.g., based on a suitable parameter of the communication link. In yet other embodiments, scaling factor calculator 48 may divide the dynamic range of $|r_{ii}|^2$ values into any other suitable set of bins.

Scaling factor calculator 48 then populates bins of the histogram with the channel power-gain values $|r_{ii}|^2$ calculated over the LTF. In an embodiment, the histogram is implemented by a set of n counters. Scaling factor calculator 48 adds a power-gain value to the histogram by incrementing the counter corresponding to the bin in which the power-gain value falls. When the histogram is completed, each bin (e.g., counter) holds the number (count) of power-gain values that fall in that bin.

Figure 2:
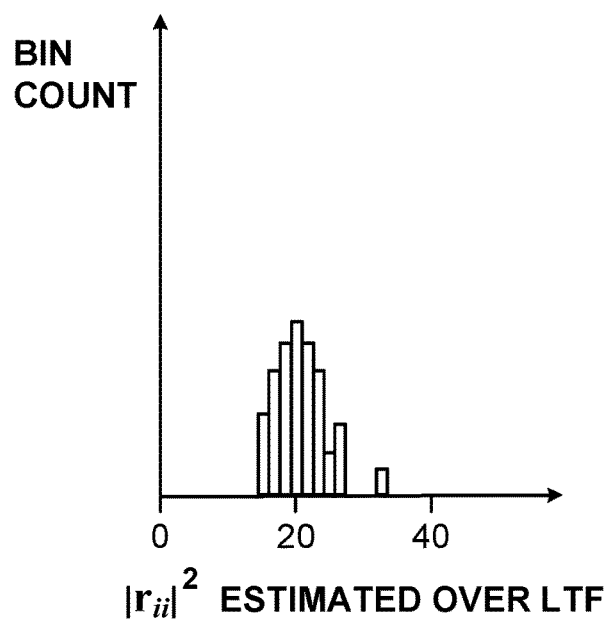
FIG. 2 is a histogram of channel parameter values calculated over a Long Training Field (LTF), in accordance with an embodiment that is described herein.

FIG. 2 is an example of a histogram of channel parameter values (in the present example power-gain values $|r_{ii}|^2$) calculated by scaling factor calculator 48 over a LTF, in accordance with an embodiment that is described herein. The horizontal axis denotes the power-gain value. The vertical axis denotes the bin count (the number of $|r_{ii}|^2$ values in the bin). In the present example the bins are of equal size, i.e., uniformly distributed. The histogram and the power-gain value distribution of FIG. 2 are depicted solely by way of example. In other embodiments and scenarios, the histogram may have any other suitable form, including, as a non-limiting example, a histogram with non-uniform bin size.

In some embodiments, scaling factor calculator 48 populates the histogram with all the $|r_{ii}|^2$ values, i.e., for all sub-carriers and for all spatial streams in the signal. In other embodiments, scaling factor calculator 48 selects a partial subset of the sub-carriers, and populates the histogram with the $|r_{ii}|^2$ values of these sub-carriers only. In yet other embodiments, scaling factor calculator 48 selects a partial subset of the spatial streams, and populates the histogram with the $|r_{ii}|^2$ values of these spatial streams only.

In still other embodiments, scaling factor calculator 48 selects and populates the histogram with the $|r_{ii}|^2$ values that correspond to both (i) a partial subset of the sub-carriers and (ii) a partial subset of the spatial streams. Any suitable criterion can be used for selecting the subset of sub-carriers and/or subset of spatial streams. In some embodiments, as seen in FIG. 1, scaling factor calculator receives as input nSD, the total number of data sub-carriers in the OFDM symbol. In an embodiment, the choice of subset of sub-carriers depends on nSD.

Below are three non-limiting examples of criteria for choosing a subset of sub-carriers or spatial streams, for use in populating the histogram:

Consider a scenario in which one or more sub-carriers are corrupted by strong noise, strong interference or spurious signals, e.g., when these sub-carriers are nulled. In an embodiment, scaling factor calculator 48 omits the $|r_{ii}|^2$ values of such sub-carriers from the histogram, and thus omits the sub-carriers from the scaling factor calculation.

Consider a scenario in which the FEC comprises a LDPC, and only a subset of the sub-carriers or spatial streams form an LDPC code word. In an embodiment, scaling factor calculator 48 chooses this sub-set for population of the histogram and calculation of the scaling factor. The sub-set may differ from one code word to another, e.g., depending on the start and end location of the code word.

In the IEEE 802.11ax standard (also referred to as High-Efficiency Wireless—HEW) it is possible to transmit "1×" and "2×" LTFs that respectively span only 25% and 50% of the sub-carriers compared to the payload. In this case, the remaining channel estimates are derived by interpolation. In an embodiment, scaling factor calculator 48 omits the $|r_{ii}|^2$ values of the interpolated sub-carriers from the histogram, and thus from the scaling factor computation.

Additionally or alternatively, in an embodiment scaling factor calculator 48 populates the histogram with $|r_{ii}|^2$ values associated with any other suitable subset of sub-carriers and/or spatial streams.

Having populated the histogram, in an embodiment scaling factor calculator 48 calculates the scaling factor. Various techniques can be used for deriving the scaling factor from the histogram. Typically, the goal of this derivation is to utilize the statistics of the $|r_{ii}|^2$ values to bring the LLRs of the payload to a dynamic range having optimal SNR while minimizing saturation. The scaling factor may be greater than unity or smaller than unity, i.e., the LLRs may be scaled up or down, as appropriate.

In some embodiments, scaling factor calculator 48 identifies a "dominant bin" of the histogram, and derives the scaling factor from the bin count of the dominant bin (the number of $|r_{ii}|^2$ values in the dominant bin). Several example ways of defining "dominant bin" are given below.

In one embodiment, the dominant bin is defined as the bin having the highest bin count in the histogram. Having identified this dominant bin, scaling factor calculator 48 may use various techniques for deriving the scaling factor. In an embodiment, scaling factor calculator 48 regards the index of the dominant bin as the mean of the $|r_{ii}|^2$ values distribution, estimates the spread (e.g., standard deviation $\sigma$) of the $|r_{ii}|^2$ values distribution around this mean, and sets the scaling factor based on the mean and spread values. In one non-limiting example, the scaling factor is set so that the maximum LLR value (the upper edge of the dynamic range at the input to FEC decoder 44) is mapped to mean+$2\sigma$. Any other suitable criterion for deriving the scaling factor from the dominant bin can be used in alternative embodiments.

In another embodiment, the dominant bin is defined as the highest-index bin (the bin corresponding to the highest $|r_{ii}|^2$ value) for which the bin count exceeds a predefined threshold. Having identified this dominant bin, scaling factor calculator 48 may use various techniques for deriving the scaling factor. For example, in histogram of logarithmically distributed bins, if the dominant bin is found to be the bin [$4\Delta$, $8\Delta$), the scaling factor may be set to $2^{n-4}$. (Note that although the bin count is used for choosing the dominant bin, the scaling factor is typically set based on the identity of the dominant bin, not its bin count.)

In one example, scaling factor calculator 48 sets the scaling factor such that the maximal value of the dominant bin is mapped to the maximal value available in the dynamic range. In another example, scaling factor calculator 48 sets the scaling factor such that the minimal value of the dominant bin is mapped to the maximal value available in the dynamic range. In yet another example, scaling factor calculator 48 sets the scaling factor such that the mean value of the dominant bin is mapped to the maximal value available in the dynamic range. In some embodiments, in any of the above examples, scaling factor calculator 48 may apply an additional back-off (additional margin below the maximal value available in the dynamic range) to the scaling factor. Further alternatively, scaling factor calculator 48 may use any other suitable method for deriving the scaling factor from the histogram of $|r_{ii}|^2$ values, not necessarily involving identifying a dominant bin.

In some embodiments, scaling factor calculator 48 performs some pre-processing of the histogram before deriving the scaling factor. In one embodiment, scaling factor calculator 48 discards part of the histogram and retains only a portion of interest, e.g., retains ("crops") only a selected interval of $|r_{ii}|^2$ values. In another embodiment, scaling factor calculator 48 multiplies one or more of the bin counts in the histogram by a predefined value ("weight"). In another embodiment, scaling factor calculator 48 identifies that a considerable part of the $|r_{ii}|^2$ values distribution lies close to zero (i.e., in the lowest-index bins) and/or close to the top of the dynamic range (i.e., in the highest-index bins), and in response applies additional scaling.

In some embodiments, scaling factor calculator 48 uses the $|r_{ii}|^2$ values (of the LTF) to populate two or more interim histograms. Scaling factor calculator 48 derives a respective interim scaling factor from each interim histogram, and combines the interim scaling factors to produce the final scaling factor that is used for scaling the LLRs of the payload.

In an example embodiment, each interim histogram (and the corresponding interim scaling factor) is associated with a respective spatial stream. In an embodiment, scaling factor calculator 48 populates Nss interim histogram, each with the $|r_{ii}|^2$ values associated with a respective spatial stream.

In another embodiment, each interim histogram (and the corresponding interim scaling factor) is associated with a respective subset of the OFDM sub-carriers. In one example, the sub-carriers are divided into k subsets of the form [0, k, 2k, 3k, . . . ], [1, k+1, 2k+1, 3k+1, . . . ], [2, k+2, 2k+2, 3k+2, . . . ], . . . , [k−1, 2k−1, 3k−1, . . . ]. The sub-carrier spacing within each subset is k (e.g., due to an assumption that the communication channel is substantially correlated for a spacing of less than k). In an embodiment, scaling factor calculator 48 populates a separate interim histogram and derives a separate interim scaling factor for each subset of k sub-carriers.

In yet other embodiments, any suitable combination of the above interim histograms and interim scaling factors, or any other suitable way of defining multiple interim histograms and interim scaling factors, can be used. Scaling factor calculator 48 may derive a respective interim scaling factor from each interim histogram using any suitable technique, for example the techniques described above.

In various embodiments, scaling factor calculator 48 may combine the interim scaling factors in any suitable way to produce the final scaling factor. In example embodiments, the scaling factor may be defined as the minimum, maximum, mean, median or mode of all interim scaling factors.

In some cases, the LTF differs from the payload in the modulation scheme used for modulating the OFDM sub-carriers. Unless this difference is accounted for, a scaling factor calculated over the LTF may be unsuitable for applying to the LLRs of the payload. In some embodiments, scaling factor calculator 48 corrects the histogram of $|r_{ii}|^2$ values, and/or the scaling factor, to account for the difference in modulation between the LTF and the payload.

In one example, the sub-carriers of the OFDM symbols that carry the LTF are modulated using Binary Phase Shift Keying (BPSK) modulation, and the sub-carriers in the OFDM symbols that carry payload 32 are modulated using M-symbol Quadrature Amplitude Modulation (M-QAM). In this example, for an Additive White Gaussian Noise (AWGN) channel, the received BPSK signal (of the LTF) can be written as:

$$y1 = x + n1 \quad \text{Equation 3:}$$

wherein x denotes the transmitted BPSK signal and n1 denotes a Gaussian noise with zero mean and variance $\sigma_n^2$. The received M-QAM signal (of the payload) can be written as:

$$y2 = x + n2 \quad \text{Equation 4:}$$

wherein x denotes the transmitted M-QAM signal and n2 denotes a Gaussian noise with zero mean and the same variance $\sigma_n^2$.

In order for the two modulation schemes to have approximately the same minimum Euclidean distance, the received M-QAM signal y2 is scaled by $\sqrt{\alpha}$, wherein $\alpha = K_{mod, M^2}$ denotes the ratio of per-bit SNRs of the two modulation schemes (BPSK and M-QAM). The scaled M-QAM signal is thus given by $$y2' = \sqrt{\alpha} x + n2' \quad \text{Equation 5:}$$

wherein n2' denotes a Gaussian noise with zero mean and the same variance $\alpha \sigma_n^2$. After scaling, the LLRs of the Least Significant Bits (LSBs) in the two modulation schemes become approximately the same. For BPSK, the LLR of the LSB is 4+4n1, whereas for M-QAM the LLR of the LSB is approximately 4+4n2. (The expression for M-QAM is approximated since it considers only the LSB. This approximation, however, is fairly accurate for high SNR.)

In some embodiments, scaling factor calculator 48 uses the above relations to correct the histogram of $|r_{ii}|^2$ values:

$$p_{LLR}(b0, M\_QAM) = \quad \text{Equation 6}$$
$$p_{LLR}(b0, BPSK)\left(4 + \sqrt{\left(\frac{\sigma_{n'}^2 \ln(\alpha)}{2} + \frac{(x-4)^2}{\alpha}\right)}\right)$$

wherein $p_{LLR}$(b0, BPSK) denotes the original histogram constructed based on the BPSK LTF, and $p_{LLR}$(b0, M_QAM) denotes the corrected histogram that is suitable for deriving a scaling factor for the LLRs of the LSBs in the M-QAM payload.

In this embodiment, scaling factor calculator 48 derives the scaling factor for the LLRs of the payload LSBs from the corrected histogram given in Equation 6. For scaling the LLRs of higher-significance M-QAM bits in the payload, scaling factor calculator 48 uses a predefined mapping between the spread (e.g., standard deviation) of LSB LLRS and the spread of the LLRs of the higher-significance bits. Example mappings are given in U.S. patent application Ser. No. 15/792,348, which was cited above and whose disclosure is incorporated herein by reference.

In alternative embodiments, scaling factor calculator 48 derives a scaling factor using the uncorrected histogram $p_{LLR}$(b0, BPSK) that was calculated over the BPSK LTF, and then corrects the scaling factor to match the M-QAM payload. Let $l_{BPSK}$ denote the dominant bin value computed from the BPSK histogram. Assuming an AWGN channel, scaling factor calculator 48 calculates a corrected dominant bin value by:

$$l_{M\_QAM} = 4 + \sqrt{\alpha} \sqrt{(l_{BPSK} - 4)^2 - \frac{\sigma_{n'}^2 \ln(\alpha)}{2}} \quad \text{Equation 7}$$

Scaling factor calculator 48 calculates the scaling factor using the corrected dominant bin value of Equation 7. This correction renders the scaling factor suitable for scaling the LLRs of the M-QAM payload.

The description above referred to an AWGN channel, by way of example. In alternative embodiments, scaling factor calculator 48 corrects the histogram and/or the scaling factor to account for differences in modulation scheme between the LTF and the payload, for an arbitrary non-AWGN channel.

For example, for a single-tap channel (i.e., a channel whose impulse response is a single complex-valued tap h), the received signal is given by:

$$y = hx + n \quad \text{Equation 8:}$$

and the LLR of the LSB is given by $$LLR(b0) = 4|h|^2 + 4h^* n \quad \text{Equation 9:}$$

In some embodiments, scaling factor calculator 48 corrects the histogram by calculating $$p_{LLR}(b0, M\_QAM) = p_{LLR}(b0, BPSK)\left(\mu_{LLR}(b0, BPSK) + \right. \quad \text{Equation 10}$$
$$\left. \sqrt{\left(\frac{\sigma_{LLR(b0,BPSK)}^2 \ln(\alpha)}{2} + \frac{(x - \mu_{LLR}(b0, BPSK))^2}{\alpha}\right)}\right)$$

wherein $\mu_{LLR}$(b0, BPSK) and $\sigma_{LLR(b0, BPSK)}^2$ denote the mean and variance of the LSB LLRs LLR(b0).

In alternative embodiments, scaling factor calculator 48 corrects the dominant bin value of the histogram, by calculating $$l_{M\_QAM} = \mu_{LLR}(b0, BPSK) + \quad \text{Equation 11}$$
$$\sqrt{\alpha} \sqrt{(l_{BPSK} - \mu_{LLR}(b0, BPSK))^2 - \frac{\sigma_{LLR(b0,BPSK)}^2 \ln(\alpha)}{2}}$$

For a multi-tap channel, scaling factor calculator 48 estimates $\mu_{LLR}(b0, BPSK)$ and $\sigma_{LLR(b0, BPSK)}^2$ to find the corrected dominant values using Equation 10 or Equation 11.

In some variants of the IEEE 802.11 standard, preamble 28 comprises both a legacy LTF (L-LTF) and a non-legacy LTF (e.g., HT-LTF, VHT-LTF or HE-LTF). In some embodiments, scaling factor calculator 48 estimates one scaling factor (referred to as legacy scaling factor) over the legacy LTF, and another scaling factor (referred to as non-legacy scaling factor) over the non-legacy LTF.

In an embodiment, scaling factor calculator 48 combines the legacy scaling factor and the non-legacy scaling factor to yield the final scaling factor. This technique is applicable, for example, when the communication channel remains constant between the legacy LTF and non-legacy LTF.

In another embodiment, metric calculator 40 uses the legacy scaling factor for scaling the LLRs of the legacy parts of preamble 28, and uses the non-legacy scaling factor for scaling the LLRs of the non-legacy (e.g., HT, VHT or HE) parts of packet 24 (parts of preamble 28 and/or payload 32).

Figure 3:
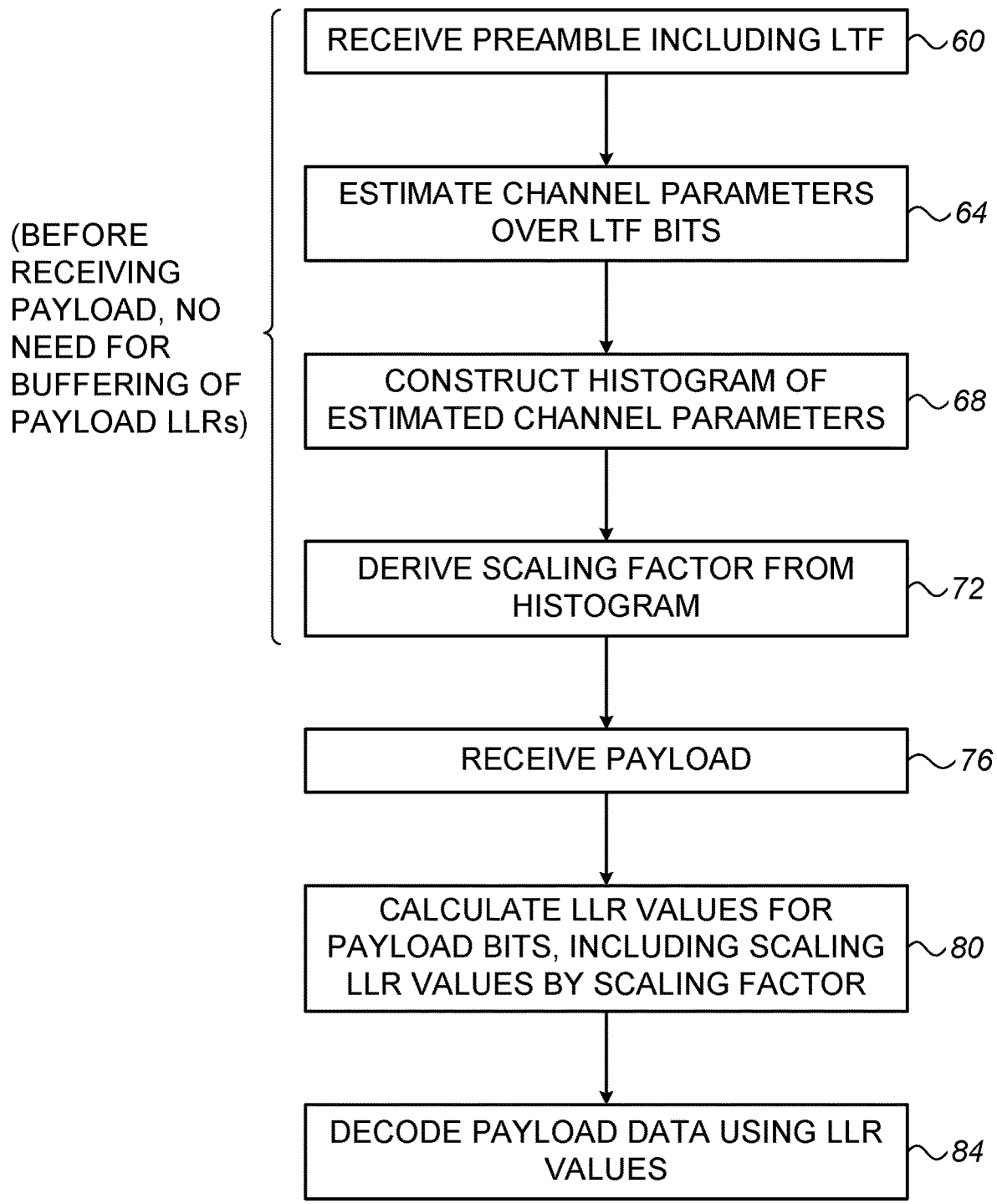
FIG. 3 is a flow chart that schematically illustrates a method for decoding payload data of a WLAN packet, including scaling of LLRs by a scaling factor calculated over a LTF, in accordance with an embodiment that is described herein.

FIG. 3 is a flow chart that schematically illustrates a method for decoding payload data of a WLAN packet, including scaling of LLRs by a scaling factor calculated over a LTF, in accordance with an embodiment that is described herein. The method begins with receiver 20 receiving preamble 28 of WLAN packet 24, at a preamble reception operation 60. The channel estimator (e.g., MIMO equalizer 36) estimates the channel parameter values (e.g., $|r_{ii}|^2$ values) over the LTF, at a channel parameter calculation operation 64.

At a histogram construction operation 68, scaling factor calculator 48 constructs a histogram of the channel parameter values (e.g., $|r_{ii}|^2$ values) estimated over the LTF. At a scaling factor derivation operation 72, scaling factor calculator 48 derives a scaling factor from the histogram.

In some embodiments, the above process (operations 60-72) is performed before payload 32 is received at receiver 20.

At a subsequent payload reception operation 76, receiver 20 receives payload 32 of packet 24. At a LLR calculation operation 80, metric calculator 40 calculates LLR values for the bits of payload 32. As part of the LLR calculation, metric calculator 40 scales the LLR values by the scaling factor that was derived at operation 72.

As explained above, in some embodiments scaling factor calculator 48 calculates the scaling factor independently of (e.g., before) the payload data whose LLRs are scaled by this scaling factor. Additionally or alternatively, in some embodiments the LTF used for calculating the scaling factor is modulated using one modulation scheme, and the payload data is modulated using a different modulation scheme.

At a decoding operation 84, FEC decoder 44 decodes the FEC-encoded data of payload 32 using the scaled LLR values.

Although the embodiments described herein mainly address WLAN packets, the methods and systems described herein can also be used in other applications, such as in any other communication protocol specifying a training field.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A receiver for receiving a signal comprising a training field and a payload over a communication channel, the receiver comprising:
a channel estimator, configured to estimate values of a parameter of the communication channel based on the training field of the received signal, wherein the training field is modulated using a first modulation scheme, and wherein the payload is modulated using a second modulation scheme that is different from the first modulation scheme;
a scaling factor calculator, configured to calculate a scaling factor based on the values of the parameter of the communication channel, and to apply to the scaling factor a correction that depends on the first modulation scheme and on the second modulation scheme;
a metric calculator, configured to calculate soft decoding metrics for use in decoding data carried by the payload of the received signal, including scaling the soft decoding metrics by the scaling factor; and
a decoder, configured to decode the data carried by the payload of the received signal using the scaled soft decoding metrics.

2. The receiver according to claim 1, wherein the training field precedes the payload in the signal, and wherein the scaling factor calculator is configured to calculate the scaling factor before a beginning of the payload is received at the receiver.

3. The receiver according to claim 1, wherein the scaling factor calculator is configured to estimate a statistical distribution of the values of the parameter of the communication channel, and to derive the scaling factor from the estimated statistical distribution.

4. The receiver according to claim 1, wherein the scaling factor calculator is configured to construct a histogram of the values of the parameter of the communication channel, and to derive the scaling factor from the histogram.

5. The receiver according to claim 4, wherein the scaling factor calculator is configured to populate the histogram with power-gain levels of the communication channel, each power-gain level calculated over a respective sub-carrier and a respective spatial stream of the signal.

6. The receiver according to claim 4, wherein the scaling factor calculator is configured to identify in the histogram a bin having a highest count of the values of the parameter of the communication channel, and to set the scaling factor depending on an identity of the bin.

7. The receiver according to claim 4, wherein the scaling factor calculator is configured to identify in the histogram a highest-index bin for which a count of the values of the parameter of the communication channel exceeds a predefined threshold, and to set the scaling factor depending on an identity of the bin.

8. The receiver according to claim 1, wherein the signal comprises a plurality of sub-carriers transmitted at respective different sub-carrier frequencies, and wherein the scaling factor calculator is configured to calculate the scaling factor over only a selected subset of the sub-carriers.

9. The receiver according to claim 1, wherein the signal comprises a plurality of spatial streams, and wherein the scaling factor calculator is configured to calculate the scaling factor over only a selected subset of the spatial streams.

10. The receiver according to claim 1, wherein the scaling factor calculator is configured to:
   calculate two or more interim scaling factors based on two or more respective parts of the training field; and
   calculate the scaling factor by combining the interim scaling factors.

11. The receiver according to claim 10, wherein the two or more parts of the training field comprise respective subsets of sub-carriers having respective different sub-carrier frequencies.

12. The receiver according to claim 10, wherein the two or more parts of the training field comprise respective spatial streams.

13. The receiver according to claim 1, wherein the scaling factor calculator is configured to correct the scaling factor to retain a same minimal Euclidean distance in the first modulation scheme and in the second modulation scheme.

14. The receiver according to claim 1, wherein the training field is comprised in a preamble of the signal, and wherein the metric calculator is configured to scale the soft decoding metrics for payload bits of the signal that are subsequent to the preamble.

15. The receiver according to claim 1, wherein the training field is comprised in a mid-amble of the signal, and wherein the metric calculator is configured to scale the soft decoding metrics for payload bits that are subsequent to the mid-amble, provided that any code word of the signal is scaled by a same scaling factor.

16. The receiver according to claim 1, wherein the scaling factor calculator is configured to calculate the scaling factor independently of any portion of the payload.

17. A method for decoding a signal comprising a training field and a payload received over a communication channel, the method comprising:
   estimating values of a parameter of the communication channel based on the training field of the received signal, wherein the training field is modulated using a first modulation scheme, and wherein the payload is modulated using a second modulation scheme that is different from the first modulation scheme;
   calculating a scaling factor based on the estimated values of the parameter of the communication channel, and applying to the scaling factor a correction that depends on the first modulation scheme and on the second modulation scheme;
   calculating soft decoding metrics for use in decoding data carried by the payload of the received signal, including scaling the soft decoding metrics by the scaling factor; and
   decoding the data carried by the payload of the received signal using the scaled soft decoding metrics.

18. The method according to claim 17, wherein the training field precedes the payload in the signal, and wherein calculating the scaling factor is performed before a beginning of the payload is received.

19. The method according to claim 17, wherein calculating the scaling factor comprises estimating a statistical distribution of the values of the parameter of the communication channel, and deriving the scaling factor from the estimated statistical distribution.

* * * * *